(12) United States Patent
Takagi

(10) Patent No.: US 6,791,150 B2
(45) Date of Patent: Sep. 14, 2004

(54) OPTICAL MODULE AND OPTICAL TRANSCEIVER APPARATUS

(75) Inventor: Shinichi Takagi, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/327,091

(22) Filed: Dec. 24, 2002

(65) Prior Publication Data
US 2003/0127661 A1 Jul. 10, 2003

(30) Foreign Application Priority Data
Dec. 27, 2001 (JP) .................................. 2001-396517

(51) Int. Cl.[7] .............................................. H01L 29/72
(52) U.S. Cl. ...................... 257/432; 257/84; 257/85; 257/92; 257/94; 257/96; 257/461; 257/470
(58) Field of Search ............................. 257/84, 85, 92, 257/94, 96, 461, 432, 470

(56) References Cited

U.S. PATENT DOCUMENTS 6,107,645 A * 8/2000 Hidaka ........................ 257/84

FOREIGN PATENT DOCUMENTS

| JP | 6-53612 | 2/1994 |
|---|---|---|
| JP | 7-15091 | 1/1995 |
| JP | 11-121862 | 4/1999 |

* cited by examiner

Primary Examiner—Edward Wojciechowicz
(74) Attorney, Agent, or Firm—Burns, Doane, Swecker & Mathis, L.L.P.

(57) ABSTRACT

A thermoelectric semiconductor has a P-type semiconductor and an N-type semiconductor disposed in parallel. A heat absorbing side of the thermoelectric semiconductor and a substrate that has an optical element mounted on its upper surface are disposed on the same plane. A heat radiation side of the thermoelectric semiconductor is disposed such that a direction from the heat absorbing side to the heat radiation side of the thermoelectric semiconductor is parallel with the upper surface of the substrate. Based on this arrangement, it is possible to set the environmental temperature of an optical module to the same level as the operation temperature of a laser diode.

19 Claims, 8 Drawing Sheets

HEAT TRANSMISSION DIRECTION
↔

HEAT TRANSMISSION DIRECTION
↔

OPTICAL MODULE AND OPTICAL TRANSCEIVER APPARATUS

BACKGROUND OF THE INVENTION

1) Field of the Invention

The present invention relates to an optical module that comprises an optical element and a thermoelectric semiconductor.

2) Description of the Related Art

The Internet has become popular. As a result, there is an increasing demand for large-capacity data transmission. For the large-capacity data transmission, it is necessary to have an optical system that can transmit optical signals via an optical fiber faster.

A laser diode is used as a light source in the optical system. An optical module transmits the light generated by the laser diode to the optical fiber.

In order to increase the transmission speed of optical signals, it is necessary to execute at high speed the intensity modulation of the light generated by the laser diode. It is also necessary to improve the performance of the optical module.

Optical modules that transmit optical signals at a high-speed bit rate of 2.5 Gb/s have been put into practical use. Moreover, development of optical modules that transmit optical signals at still higher speed of 10 Gb/s have been progressed.

In order to realize large-capacity optical communications, it is necessary to provide a high-density optical fiber network by using an optical module that can transmit optical signals at a high-speed bit rate. For this purpose, a stable supply of low-cost optical modules has been desired.

FIGS. 9A and 9B show structures of a conventional optical module disclosed in Japanese Patent Application Laid-Open No. H11-121862. FIG. 9A shows a top plan view of the conventional optical module in a state that an upper lid is dismounted. FIG. 9B shows a side view of this optical module cut along a line A—A.

In FIGS. 9A and 9B, a reference number 1 denotes a laser diode that converts an electric signal into an optical signal, 2 denotes a mount on which the laser diode 1 is mounted, and 3 denotes a carrier on the upper surface of which the mount 2 is installed. A reference number 4 denotes a package that accommodates the carrier 3 and seals the laser diode 1, and 5 denotes a thermistor that is provided on the upper surface of the carrier 3. A reference number 6 denotes a thermo-module that heats or cools the laser diode 1 to avoid a fluctuations in the temperature of the laser diode 1 due to the heating of the laser diode 1 by itself or the heat from the outside of the package 4. Such heating or cooling of the laser diode 1 is performed to stabilize the characteristic of the laser diode 1. A reference number 7 denotes a terminal that transmits signals between the carrier 3 and the outside of the package 4. The elements 1 to 7 constitute an optical module 8.

An automatic temperature control (ATC) circuit 9 is provided outside of the package 4.

To execute intensity modulation of optical signals, a bias current Ib and a modulation current Im is applied to the laser diode 1. When there is a rise in the temperature of the laser diode 1, the light output of the laser diode 1 decreases, or the oscillation stops. When there is a fall in the temperature of the laser diode 1, the light output increases. The temperature of the laser diode 1 rises even as a result of self-heating.

The ATC circuit 9 inputs-outputs control signals to/from the optical module 8 via the terminal 7. The ATC circuit 9 receives information from the thermistor 5, which detects the temperature of the laser diode 1, about the temperature of the laser diode 1, and adjusts a driving current Is supplied to the thermo-module 6 based on the temperature of the laser diode 1 so that the laser diode 1 is always kept at a constant temperature. Since the temperature of the laser diode 1 is always constant, a stable optical output can always be obtained from the laser diode 1.

The thermo-module 6 is usually constructed of about 12 to 40 thermoelectric semiconductors. Each thermoelectric semiconductor consists of an N-type semiconductor 10a and a P-type semiconductor 10b. The thermoelectric semiconductors are arranged parallel to each other. The thermoelectric semiconductors conduct heat in a direction (heat transmission direction) that is parallel to the long side of the paper on which the FIG. 9B has been drawn. Each thermoelectric semiconductor is connected to a dielectric substrate at each end of the thermoelectric semiconductor in the heat transmission direction. For example, dielectric substrate 11a is connected to one end and dielectric substrate 11b is connected to the other end of the N-type semiconductor 10a. Wiring patterns are prepared in the dielectric substrates. The dielectric substrates of one thermoelectric semiconductor are electrically connected to the dielectric substrates of adjoining thermoelectric semiconductor such that all the thermoelectric semiconductors are connected in series.

The thermoelectric semiconductors operate according to the Peltier effect. Whether to perform heating or cooling, can be decided by simply changing the direction of the current supplied to the thermoelectric semiconductors. Therefore, the thermoelectric semiconductors are suitable for the temperature control of the laser diode 1.

In the conventional optical module, the thermo-module 6 is mounted on the base of the package 4, and the carrier 3 is mounted on the thermo-module 6, so that the heat transmission direction of the thermoelectric semiconductors becomes parallel to the height direction of the thermoelectric semiconductor. However, because the thermo-module 6 is mounted on the base, and the carrier 3 is mounted on the thermo-module 6, there has been a problem that the height of the optical module increases. Consequently, the package becomes large, and this has been a barrier for the cost reduction of the optical module.

Moreover, since a large number of the thermoelectric semiconductors are used, the workload on the thermo-module 6 increases, and the total power consumption increases. Further, the assembling becomes complex and takes time. In addition, the ATC circuit 9, which is expensive, has to be provided. These factors have also interrupted the cost reduction of the optical module.

Optical modules that do not have the above mentioned problems have been developed and appeared in the market. These optical modules use a mini dual in-line (mini-DIL) type package. Moreover, these optical modules do not have a thermo-module. Therefore, it is possible to decrease the height of the optical module, and realize low cost.

However, in order to output a stable optical signal at the transmission speed of the order of 10 Gb/s or more, it is necessary to minimize the operation temperature of the laser diode. Concretely, it is necessary to set the operation temperature of the laser diode to about 70° C. or below. However, there is a demand that the optical module even functions at the environmental temperature of about 70° C. If the environmental temperature is 70° C., the temperature of the laser diode becomes higher and exceeds the operation temperature of the laser diode due to self-heating.

Consequently, it is not possible to stably operate the laser diode if the environmental temperature is 70° C. or higher.

Therefore, there have been problems that, if the environmental temperature is 70° C. or higher, then either that laser diode does not exhibit desired characteristics or a provision has to be made to cool the surrounding of the laser diode so that the environmental temperature falls to 65° C. or below.

Various technical developments have been carried out so far to expand the range of operation temperature of the laser diode. However, expansion of the operation temperature of the laser diode has always been a difficult task.

To conclude, the conventional optical modules have a problem that the overall height is tall and cost reduction is not possible. Moreover, the optical modules that use the mini dual in-line (mini-DIL) type package and do not have a thermo-module have a problem that the temperature control of the laser diode is not possible (because there is no thermo-module).

SUMMARY OF THE INVENTION

It is an object of this invention to provide a low-cost and small optical module and that can achieve a high-speed operation even at a high temperature.

The optical module according to one aspect of the present invention has a substrate and an optical element is mounted on the surface of this substrate. Moreover, there is a thermoelectric semiconductor that has a P-type semiconductor and an N-type semiconductor disposed in parallel, the thermoelectric semiconductor having two ends, a heat radiation side, and a heat absorbing side. This thermoelectric semiconductor is arranged such that at least one end of the thermoelectric semiconductor is mounted on the surface of the substrate, and a direction from the heat absorbing side to the heat radiation side is parallel with the substrate. As referred to herein the words "radiate" or "radiation" are used in a generic sense to refer to the transfer or giving off of heat, rather than to any specific means of transferring or giving off heat such as electromagnetic radiation.

The optical module according to another aspect of the present invention has an optical element and a thermoelectric semiconductor that has a P-type semiconductor and an N-type semiconductor disposed in parallel. The P-type semiconductor and the N-type semiconductor have two ends. Moreover, there is a first substrate having at least front and rear surfaces. The optical element is mounted on the front surface on the first substrate, and a side surface of one end of the P-type semiconductor and a side surface of one end of the N-type semiconductor are connected to the front surface of the first substrate. Moreover, there is a second substrate that is disposed with a distance from the first substrate. The second substrate has at least front and rear surfaces. A side surface of the other end of the P-type semiconductor and a side surface of the other end of the N-type semiconductor are connected to the front surface of the second substrate. Moreover, there is a base on which the rear surfaces of the first and second substrates are mounted.

The optical module according to still another aspect of the present invention has an optical element and a thermoelectric semiconductor that has a P-type semiconductor and an N-type semiconductor disposed in parallel. The P-type semiconductor and the N-type semiconductor have two ends. Moreover, there is a first substrate having at least front and rear surfaces. The optical element is mounted on the front surface on the first substrate, and a side surface of one end of the P-type semiconductor and a side surface of one end of the N-type semiconductor are connected to the front surface of the first substrate. Moreover, there is a second substrate that is disposed with a distance from the first substrate. The second substrate has at least front and rear surfaces. A side surface of the other end of the P-type semiconductor and a side surface of the other end of the N-type semiconductor are connected to the front surface of the second substrate. Moreover, there is a case on which the rear surfaces of the first and second substrates are mounted.

The optical module according to still another aspect of the present invention has an optical element and a thermoelectric semiconductor that has a P-type semiconductor and an N-type semiconductor disposed in parallel. The P-type semiconductor and the N-type semiconductor have two ends. Moreover, there is a substrate having at least one surface. The optical element is mounted on the surface of the substrate. A side surface of one end of the P-type semiconductor and a side surface of one end of the N-type semiconductor are connected to the surface of the substrate. Moreover, there is a case that houses the substrate and that has a side wall. The side wall has a surface that is disposed at a distance from the substrate. A side surface of the other end of the P-type semiconductor and a side surface of the other end of the N-type semiconductor are connected to the surface of the side wall.

The optical module according to still another aspect of the present invention has an optical element and a thermoelectric semiconductor that has a P-type semiconductor and an N-type semiconductor disposed in parallel. The P-type semiconductor and the N-type semiconductor have two ends. Moreover, there is a substrate provided with a first electrode that is disposed near the optical element, and second and third electrodes disposed at a distance from the optical element. A side surface of one end of the P-type semiconductor and the N-type semiconductor respectively is connected to the first electrode. A side surface of the other end of the P-type semiconductor is connected to the second electrode. A side surface of the other end of the N-type semiconductor is connected to the third electrode.

The optical module according to still another aspect of the present invention has a substrate and an optical element is mounted on the surface of this substrate. Moreover, there is a thermoelectric semiconductor that has a P-type semiconductor and an N-type semiconductor disposed in parallel, the thermoelectric semiconductor having two ends. Moreover, there is a first conductor connected to one end surface of the P-type semiconductor and the N-type semiconductor respectively and the surface side of the substrate. There is a second conductor connected to the other end surface of the P-type semiconductor and the surface of the substrate. There is a third conductor connected to the other end surface of the N-type semiconductor and the surface side of the substrate.

The optical module according to still another aspect of the present invention has an optical element and a thermoelectric semiconductor that has a P-type semiconductor and an N-type semiconductor disposed in parallel. The P-type semiconductor and the N-type semiconductor have two ends. Moreover, there is a dielectric substrate that is connected to a side surface of one end and a side surface of the other end of the P-type semiconductor respectively, and to a side surface of one end and a side surface of the other end of the N-type semiconductor respectively. This dielectric substrate has a portion not in contact with the P-type semiconductor between the one end and the other end of the P-type semiconductor, and having a portion not in contact with the N-type semiconductor between the one end and the other end of the N-type semiconductor. Moreover, there is a substrate on which the optical element and the dielectric substrate are mounted.

The optical transceiver apparatus according to still another aspect of the present invention has an optical module and a circuit that provides a constant current to the thermoelectric semiconductor in the optical module to drive the thermoelectric semiconductor. This optical module is the optical module according to any one of the aspects according to the present invention described above.

These and other objects, features and advantages of the present invention are specifically set forth in or will become apparent from the following detailed descriptions of the invention when read in conjunction with the accompanying drawings.

DETAILED DESCRIPTIONS

Embodiments of the optical module and the optical transceiver apparatus according to the present invention will be explained below with reference to the accompanying drawings.

Figure 1A:
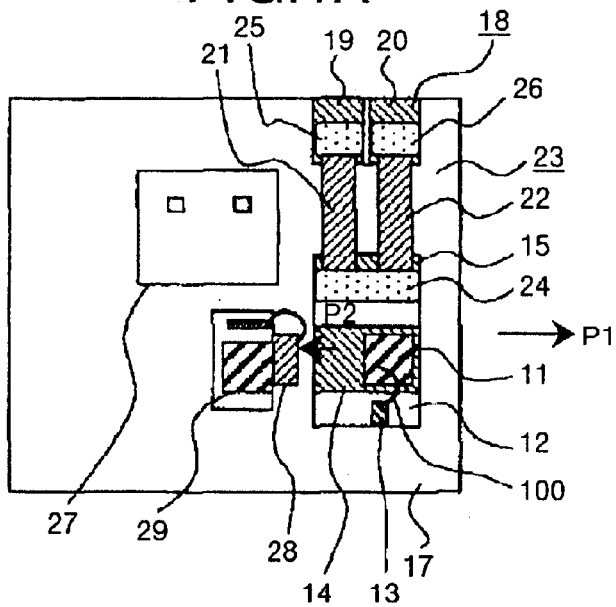
FIGS. 1A to 1F show a structure of a carrier of an optical module according to a first embodiment of the present invention.
Figure 1B:
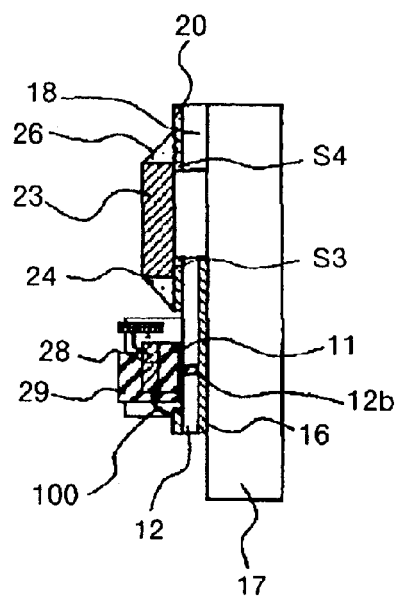
Figure 1C:
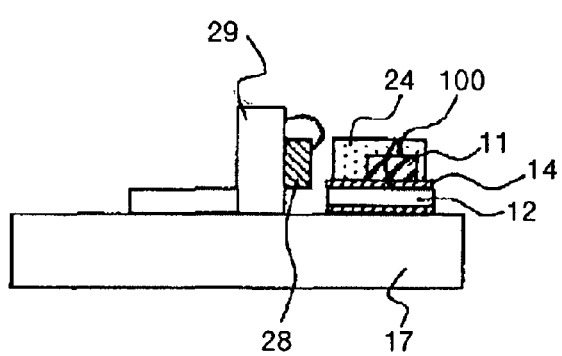
Figure 1D:
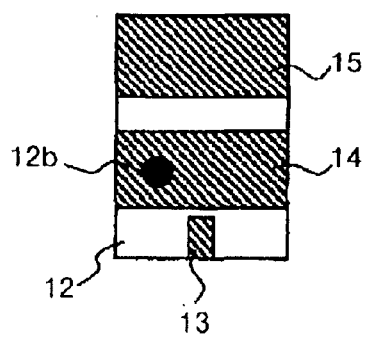
Figure 1E:
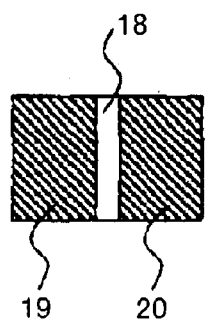
Figure 1F:
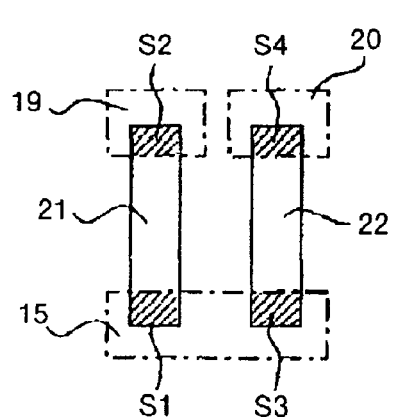

FIG. 1A is a top plan view of an upper portion of a carrier of an optical module according to the first embodiment. FIG. 1B is a side view of the optical module that is observed from the right of the optical module shown in FIG. 1A. FIG. 1C is a side view of the optical module that is observed from the bottom of the optical module shown in FIG. 1A. FIG. 1D is a view that shows an example of a conductor pattern on an upper surface of a first substrate that is mounted on the upper portion of the carrier shown in FIG. 1A. FIG. 1E is a view that shows an example of a conductor pattern on an upper surface of a second substrate that is mounted on the upper portion of the carrier. FIG. 1F is a top plan view that shows a contact surface between thermoelectric semiconductors and pattern electrodes that are provided on the first and second substrates, where solid lines show lower surfaces of the thermoelectric semiconductors and one-dot chain lines show the pattern electrodes.

In FIGS. 1A to 1F, a reference number 11 denotes an optical element that emits an optical signal P1 from the front surface and emits an optical signal P2 from the rear surface. A laser diode that emits a laser beam based on laser oscillation is used for the optical element, for example. A reference number 12 denotes a first substrate on which the optical element 11 is mounted and which is prepared using a dielectric material such as aluminum nitride (AlN) or silicon carbide (SiC) that has high thermal conductivity.

A reference number 13 denotes a conductor line that is provided on the upper surface of the first substrate 12. A reference number 14 denotes a ground conductor that is provided on the upper surface of the first substrate 12 and is connected with the lower surface (the anode side) of the optical element 11. A reference number 15 denotes a pattern electrode provided on the upper surface of the first substrate 12.

A reference number 16 denotes a ground conductor that is provided on the lower surface of the first substrate 12. The ground conductor 14 and the ground conductor 16 are connected together via a through-hole 12b that is provided on the first substrate 12. With this arrangement, the conductor line 13 and the ground conductor 16 constitute a microstrip line and the like.

The ground conductor 14 is disposed between the conductor line 13 and the pattern electrode 15. The conductor line 13, the ground conductor 14, and the pattern electrode 15 are disposed with a distance from each other. Based on this, these elements are insulated from each other. Depending on a state of a current supply to the optical element 11, the conductor line 13 may be disposed between the ground conductor 14 and the pattern electrode 15.

A reference number 17 denotes a carrier on the upper surface of which the first substrate 12 is mounted. This carrier is constructed of a dielectric substrate such as a metal conductor of iron-nickel-cobalt alloy (a product name KOVAR) or copper wolfram (CuW) or an aluminum oxide ($Al_2O_3$) ceramic substrate.

Based on the electric connection of the ground conductor 16 to the surface of the carrier 17, the carrier 17 as a whole becomes a ground conductor when the carrier 17 is an electric conductor. When the carrier 17 is a dielectric, the conductor pattern provided on the surface of the carrier becomes a ground conductor.

A reference number 18 denotes a second substrate that is mounted on the upper surface of the carrier 17 and that is prepared using a dielectric material such as aluminum nitride (AlN) or silicon carbide (SiC) that has high thermal conductivity. A reference number 19 denotes a pattern electrode provided on the upper surface of the second substrate 18. A reference number 20 denotes a pattern electrode provided on the upper surface of the second substrate 18.

A reference number 21 (see FIG. 1F) denotes a P-type semiconductor that has a side surface S1 of one end connected to the pattern electrode 15 and has a side surface S2 of the other end connected to the pattern electrode 19. This P-type semiconductor has a prism shape and it is long in a heat transmission direction. A reference number 22 denotes an N-type semiconductor that has a side surface S3 of one end connected to the pattern electrode 15 and has a side surface S4 of the other end connected to the pattern electrode 20. This N-type semiconductor forms a prism shape that is long in a heat transmission direction. A reference number 23 denotes a thermoelectric semiconductor that is constructed of a pair of the P-type semiconductor 21 and the N-type semiconductor 22.

The pattern electrode 19 and the pattern electrode 20 are disposed with a distance therebetween in a direction that the P-type semiconductor 21 and the N-type semiconductor 22 face each other. Based on this, the pattern electrode 19 and the pattern electrode 20 are insulated from each other.

When the length of the thermoelectric semiconductor is set five times or more of the length of the cross portion, for example, it is possible to reduce the conduction of heat from the heat radiation surface to the heat absorption surface. It is also possible to increase the thermal resistance of the thermoelectric semiconductor itself.

A reference number 24 denotes a triangular prism-shaped solder. This solder is connected to one end surface of the P-type semiconductor 21 and to one end surface of the N-type semiconductor 22, and is also connected to the pattern electrode 15. The pillar axis direction is in the direction that the P-type semiconductor 21 faces the N-type semiconductor 22. A lead tin (Pb—Sn) solder or a conductive adhesive agent is used for this solder.

A reference number 25 denotes a triangular prism-shaped solder. This solder is connected to the other end surface of the P-type semiconductor 21 and to the pattern electrode 19, and the pillar axis direction is in the direction that the P-type semiconductor 21 faces the N-type semiconductor 22. A lead tin (Pb—Sn) solder or a conductive adhesive agent is used for this solder.

A reference number 26 denotes a triangular prism-shaped solder. This solder is connected to the other end surface of the N-type semiconductor 22 and to the pattern electrode 20, and the pillar axis direction is in the direction that the P-type semiconductor 21 faces the N-type semiconductor 22. A lead tin (Pb—Sn) solder or a conductive adhesive agent is used for this solder.

A reference number 27 denotes a bias circuit that is provided on the upper surface of the carrier 17, and 28 denotes a photodiode that receives the optical signal P2 and outputs a monitoring current Id according to the received light amount. A reference number 29 denotes a photodiode carrier that has a cathode (rear surface) of the photodiode 28 connected to a first pattern electrode provided on the side surface, and has an anode (light-receiving surface) of the photodiode 28 connected to a second pattern electrode provided on the side surface and the upper surface via a conductor wire. The bottom surface of the photodiode carrier 29 is connected to the surface of the carrier 17. The photodiode 28 and the photodiode carrier 29 constitute a light detector.

Figure 2A:
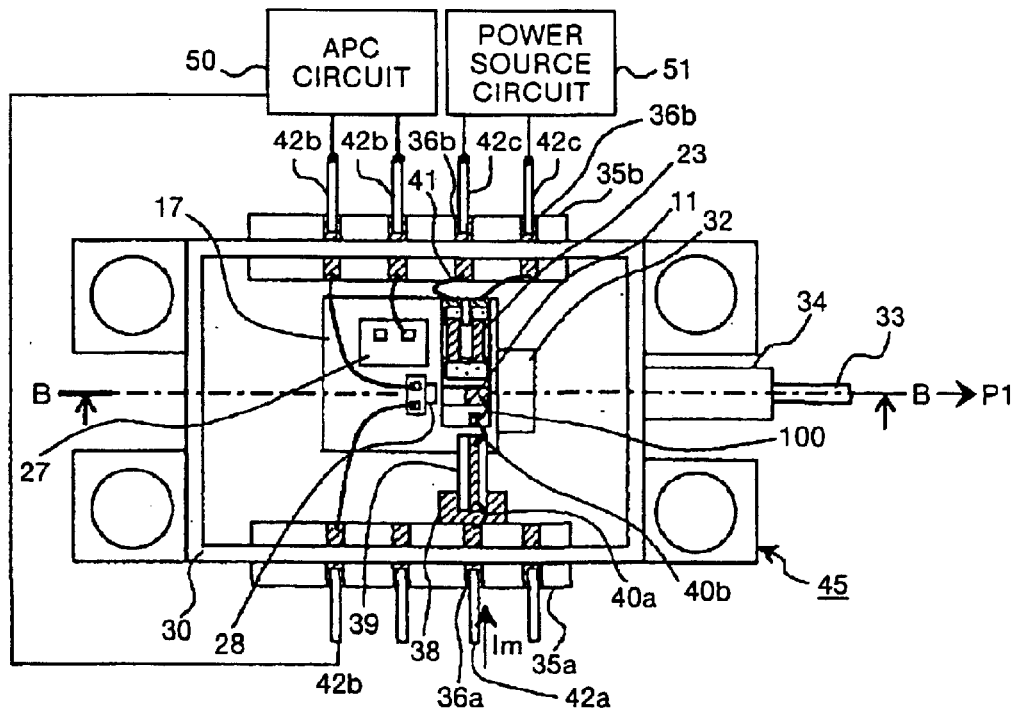
FIGS. 2A to 2C show a structure of the optical module according to the first embodiment of the present invention, FIG. 3 explains how the thermal radiation takes place in a thermoelectric semiconductor according to the first embodiment of the present invention.
Figure 2B:
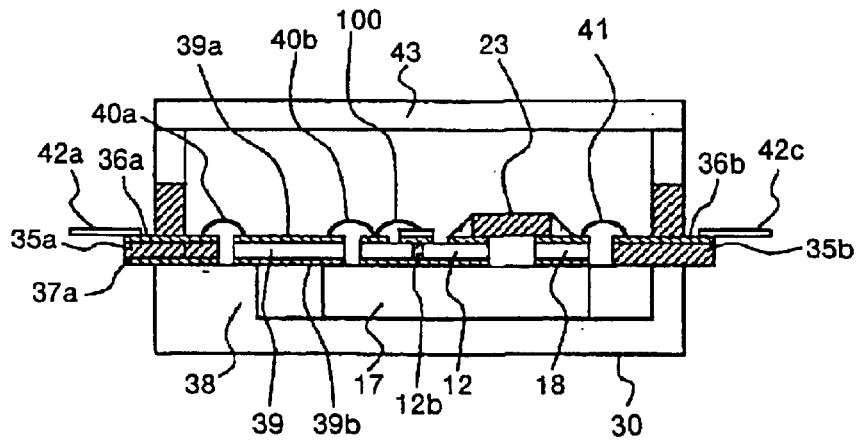
Figure 2C:
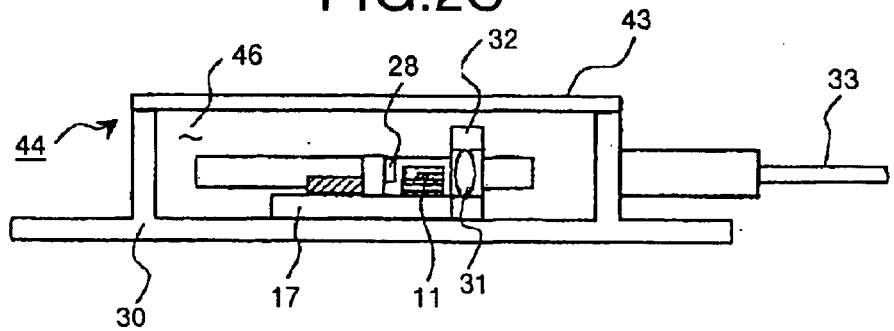

FIGS. 2A to 2C are views that show the structure of the optical module that accommodates the carrier 17. FIG. 2A is a top plan view of the optical module in the state that the cover of the optical module has been removed. FIG. 2B is a side cross-sectional view of the optical module in the direction of the optical element 11 observed from the connection surface of the lens holder of the optical module, which has been turned to the right by 90 degrees on the paper. FIG. 2C is a side view of the optical module cut along a line B—B.

A reference number 30 denotes a case that accommodates the first and second substrates 12 and 18, and the carrier 17 that is mounted with the photodiode carrier 29, in the state that these elements have been connected together with solder. This case is constructed of a metal having high thermal conductivity that can be YAG welded as represented by iron-nickel-cobalt alloy (a product name KOVAR), or various dielectric ceramics such as an aluminum oxide ($Al_2O_3$) ceramic. When the case is constructed of a dielectric ceramic, a metal seal ring is connected to the upper surface of the case to have a welding with the cover. Gold is partially metalized on the surface of the case.

A reference number 31 denotes a lens that collects output light of the optical element 11, and outputs the light to the optical fiber. A reference number 32 denotes a lens holder that holds the lens 31 and is connected to the front side surface of the carrier 17 (the side surface of the optical element 11) by YAG welding. The lens holder 32 is made of a metal that is suitable for YAG welding with the carrier 17. A reference number 33 denotes an optical fiber that transmits the optical signal output from the optical element 11 to the outside. A reference number 34 denotes an optical fiber holder that holds the optical fiber 33, and holds a second lens not shown that collects the light passed through the lens 31.

A reference number 35a denotes a convex feed-through that is engaged with and connected with a concave groove that is provided on the side wall of the case 30 at the right side of the case 30 facing the optical fiber 33 from the optical element 11. This convex feed-through can be constructed of various dielectric ceramics such as an aluminum oxide ($Al_2O_3$). A reference number 35b denotes a convex feed-through that is engaged with and connected with a concave groove that is provided on the side wall of the case 30 at the left side of the case 30 facing the optical fiber 33 from the optical element 11. A reference number 36a denotes a conductor line that has a plurality of lines disposed with a distance from each other on the upper surface of the feed-through 35a that is stretched from the case 30. These lines are formed to run from the outside of the case to the inside of the case. A reference number 36b denotes a conductor line that has a plurality of lines disposed with a distance from each other on the upper surface of the feed-through 35a that is stretched from the case 30. These lines are formed to run from the outside of the case to the inside of the case: A reference number 37a denotes a ground conductor that is provided on the lower surface of the feed-through 35a. A reference number 38 denotes a projection portion having a flat upper surface that is provided in stretch from the side wall of the case 30 to the inside at the feed-through 35a side of the case 30. When the case 30 is made of ceramic, the ground conductor is provided on the upper surface of the projection portion 38.

A reference number 39 denotes a connection substrate that has the lower surface of one end connected to the upper surface of the carrier 17 at the side edge of the feed-through 35a side of the carrier 17. A conductor line 39a that constitutes a micro strip line or the like is provided on the upper surface of the connection substrate 39. A ground conductor 39b is provided on the lower surface of the connection substrate 39. The connection substrate 39 has the lower surface of the other end connected to the upper surface of the projection portion 38 so that the connection substrate 39 is grounded.

A reference number 40a denotes a connection conductor that connects the conductor line 39a to the conductor line 36a on the feed-through 35a at the other end of the connection substrate 39. A gold wire, a gold ribbon or the like is used for the connection conductor 40a. A reference number 40b denotes a connection conductor that connects the conductor line 39a to the conductor line 13 on the first substrate 12 at one end of the connection substrate 39. A gold wire, a gold ribbon or the like is used for the connection conductor 40a. A reference number 41 denotes a connection conductor that connects together the conductor line 19 and the conductor line 20 that are provided on the second substrate 18, and the conductor line 36b on the feed-through 35b. A gold wire, a gold ribbon or the like is used for the connection conductor 41. A reference number 42a denotes a lead terminal that is connected to the conductor line 36a via the feed-through 35a. A reference number 42b denotes a lead terminal that is connected to the photodiode carrier 29 via the feed-through 35b and the wire 17. A reference number 42c denotes a lead terminal that is connected to a power source circuit 51 via the feed-through 35b.

A reference number 43 denotes a cover that is connected to the upper surface of the case 30 with seam welding or the like, to seal the opening of the case 30. The case 30 and the cover 43 constitute a package 44 of the optical module.

The carrier 17 on which the first and second substrates 12 and 18 and the thermoelectric semiconductor 23 or the like are mounted is installed on the bottom surface inside the case 30. This carrier 17 is connected with the cover 43 to structure an optical module 45. Dry nitrogen 46 is sealed in the package 44.

A reference number 50 denotes an APC (automatic power control) circuit that is provided at the outside of the package 44. The APC circuit 50 is electrically connected to the lead terminal 42b. A reference number 51 denotes a power source circuit that is provided at the outside of the package 44. The power source circuit 51 is electrically connected to the lead terminal 42c that is connected to the thermoelectric semiconductor 23.

The optical module 45, the APC circuit 50, and the power source circuit 51 are installed on the circuit substrate, and they are accommodated in a casing not shown to structure an optical transmitter.

The operation of the optical module of the present embodiment that has the above structure will be explained next. The operation of the optical element will be explained first.

A modulation current Im (a pulse signal) is output from an external driver not shown, and is supplied to the lead terminal 42a. The modulation current Im supplied to the conductor line 36a from the lead terminal 42a is transmitted to the conductor line 13 on the first substrate 12 via the connection conductor 40a, the conductor line 39a, and the connection conductor 40b. The modulation current Im is further transmitted to the signal terminal (the cathode) of the optical element 11 via the connection conductor 100. The transmitted modulation current Im includes a high-speed Rf signal of 2.5 GHz or 10 Ghz, for example. A bias current Ib is supplied from the external APC circuit 50 via the lead terminal 42b and the conductor line 36b. The bias current Ib is supplied to the optical element 11 via the bias circuit 27.

The optical element 11 is supplied with the bias current Ib and the modulation current Im, and laser oscillates. The optical element 11 emits the optical signal that has been intensity modulated based on the modulation current Im, to the front surface and the rear surface. The optical signal P1 that has been emitted from the front of the optical element 11 is collected by the lens 32. This collected light is incident to the core of the optical fiber 33 from its one end surface, and the optical signal P1 is propagated through the optical fiber 13.

On the other hand, the optical signal P2 that has been emitted from the back of the optical element 11 is received by the photodiode 28. A monitoring current Id according to the received light level is output to the conductor line 35b via the signal pattern electrode of the photodiode carrier 29. The monitoring current Id is output from the lead terminal 42b to the APC circuit 50. Based on this monitoring current Id, the APC circuit 50 adjusts the bias current Ib that is applied to the optical element 11 so that the light output of the optical element 11 has constant intensity.

The heat radiation operation of the optical element 11 that uses the thermoelectric semiconductor 23 of the first embodiment will be explained with reference to FIG. 3.

Figure 3:
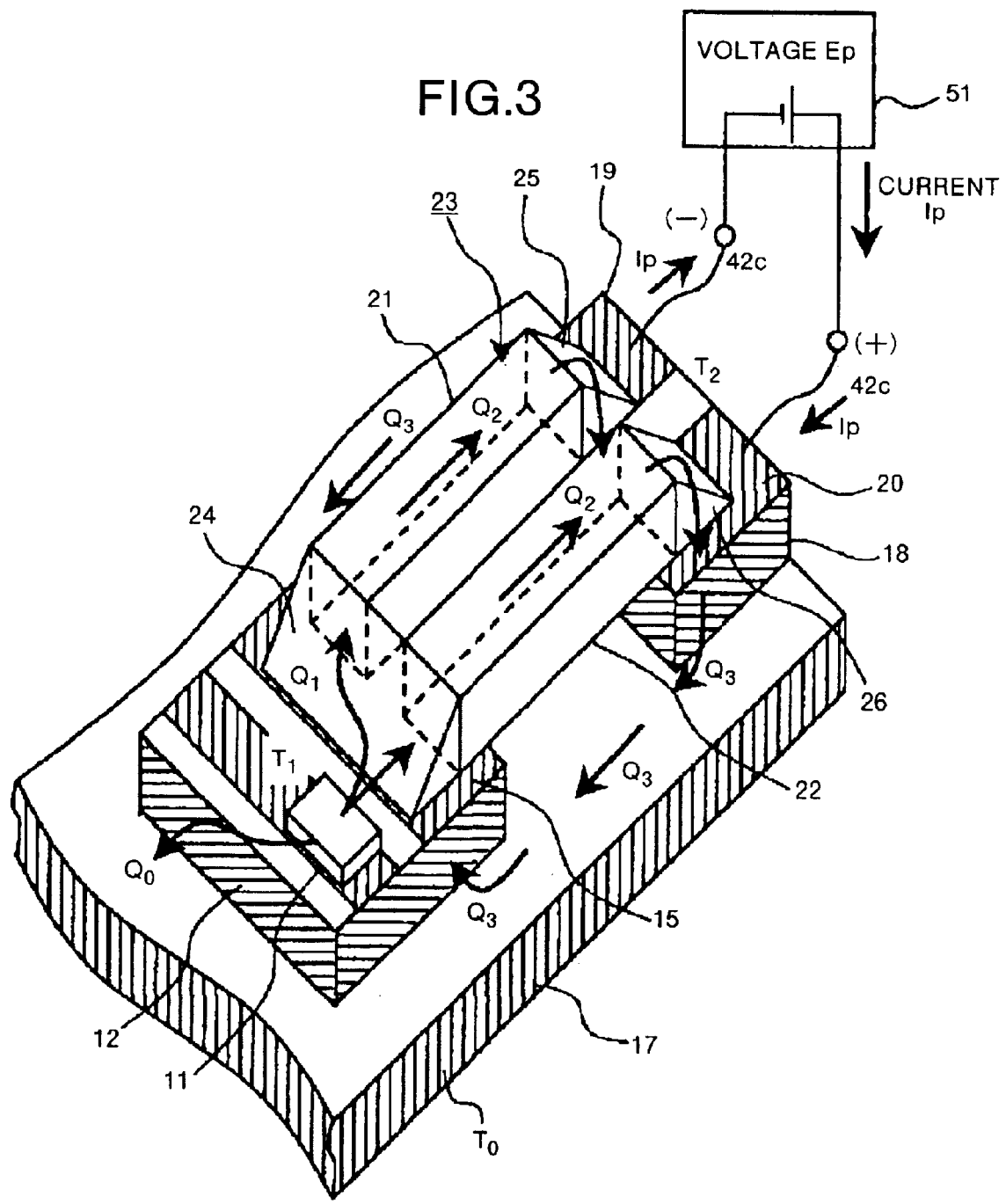

FIG. 3 shows a radiation route of the heat that has been generated from the laser diode device 11. In FIG. 3, the external power source circuit 51 is connected to the lead terminal 42c. A positive electrode (+) side of the lead terminal 42c is connected to the pattern electrode 20 via the conductor line 35b and the connection conductor 41 shown in FIG. 2A. A negative electrode (−) side of the lead terminal 42c is connected to the pattern electrode 19 via the conductor line 35b and the connection conductor 41.

When a power source voltage Ep is applied to the lead terminal 42c, a constant driving current Ip is input from the positive electrode (+) and is supplied to the pattern electrode 20. This driving current Ip is supplied from the pattern electrode 20 to the N-type semiconductor 22, and is further supplied to the P-type semiconductor 21 that is connected in series with the N-type semiconductor 22 via the pattern electrode 15. This driving current Ip flows from the pattern electrode 19 to the negative electrode (−) of the lead terminal 42c. The thermoelectric semiconductor 23 that has the P-type semiconductor 21 and the N-type semiconductor 22 in a pair shifts the heat that has been absorbed from the pattern electrode 15 based on the Peltier effect, and radiates to the pattern electrodes 18 and 19. The thermoelectric semiconductor 23 operates as a heat pump in this way.

The heat generated by the laser diode device 11 is divided into heat Q1 that is conducted from the lower surface of the first substrate 12 to the thermoelectric semiconductor and heat Q0 that is radiated to the carrier 17. The heat Q1 is conducted to the first substrate 12 from the ground conductor 14 that is connected to the lower surface of the laser diode device 11. This heat is conducted in the direction of the surface of the first substrate 12, and is further conducted to the solder 24 that is connected to the pattern electrode 15. The heat that has been conducted to the solder 24 is transmitted through the solder 24, and is conducted to the thermoelectric semiconductor 23 from the connection surface between the P-type semiconductor 21 and the N-type semiconductor 22.

The thermoelectric semiconductor 23 shifts the heat Q2 that has entered from the connection surface of the solder 24 to the connection surface between the solder 25 and the solder 26 based on the heat pump operation. The heat is radiated to the solder 25 and the solder 26. The heat that has been conducted to the solder 25 and the solder 26 is radiated to the second substrate 18 via the pattern electrodes 19 and 20. The heat is conducted through the second substrate 18, and is radiated to the carrier 17. The carrier 17 returns a part of heat Q3 that has been radiated from the second substrate 18, to the first substrate 12 from the second substrate 18.

The rest of the heat radiated from the second substrate 18 is conducted to other portions of the carrier 17, and is radiated to the bottom surface of the case 30 or to internal air 46 of the package.

As a result, a temperature T1 of the upper surface of the first substrate 12 becomes lower than a temperature T2 of the upper surface of the second substrate 18.

An estimation of radiation effect was made for a laser diode that has heat Q1 equal to 0.05 W and that is capable of emitting light at a high-data rate of 10 Gb/s used as the optical element 11. To carry out this calculation, a quadratic prism has been used for the thermoelectric semiconductor 23 that has a width wp=0.6 mm, a thickness dp=0.6 mm, and a length lp=1.0 mm. Further, KOVAR (thermal conductivity 1=21.5 W/m×K) has been used for the carrier 17 that has a width wc=1.0 mm, a length lc=3.0 mm, and a thickness lc=0.4 mm.

The results of this calculation show that when power of a current Ip=1.1 A and a voltage Ep=0.06 V is supplied to the thermoelectric semiconductor 23, it is possible to set a temperature difference (ΔT) between the temperature T2 of the second substrate and the temperature T1 of the first substrate to 5° C.

In other words, when the thermoelectric semiconductor is used to radiate heat from the first substrate 12 to the second substrate 18, it is possible to radiate heat corresponding to the heat generated from the optical element 11 by using a pair of thermoelectric semiconductors. When the environmental temperature at which the optical module is used is 70° C., it is possible to restrict the temperature of the connection surface of the optical element to about 65° C. as the operation temperature of the optical element.

In the above calculation, the heat Q3 that returns from the second substrate to the first substrate has been obtained as follows.

$$Q3 = \Delta T \times \lambda \times tc \times wc/lp$$
$$= 5 \text{ (° C.)} \times 21.5 \text{ } (W/m \cdot K)/1000 \times$$
$$0.4 \text{ (mm)} \times 1.0 \text{ (mm)}/1.0 \text{ (mm)}$$
$$= 0.04 \text{ } (W).$$

Further, in the above calculations it is assumed that the heat generation from other electronic parts within the optical module is negligible.

As explained above, when a thermoelectric semiconductor is mounted on the upper surface of a substrate on which the optical element 11 is mounted, and when an arrangement is provided such that the heat from the optical element 11 is radiated far away from the optical element 11, it is possible to set the operation temperature of the optical module used to a temperature near the operation temperature of the optical element. Further, when the number of thermoelectric semiconductor is increased, it is possible to further lower the difference between the temperature of the carrier 17 and the temperature of the optical element 11.

When the thermoelectric semiconductor is driven at a constant driving current Ip, it is possible to minimize a variation in the cooling capacity, and it is possible to obtain a stable cooling capacity without the ATC circuit.

At least a pair of thermoelectric semiconductors are laid out to make the heat transmission direction parallel with the first substrate on which the optical element is mounted, unlike the conventional temperature control method of keeping the temperature of the optical element to a constant level by mounding the carrier on a plurality of pairs of thermoelectric semiconductors. Based on this layout, it is possible to lower the height of the optical module and make the package small. Therefore, it is possible to lower the cost of parts.

As the number of thermoelectric semiconductors used is small, and the thermoelectric semiconductors can be laid out with the longitudinal direction in lateral, it is easy to install the thermoelectric semiconductors. Further, it is possible to lower the manufacturing cost and the cost of the parts.

The heat generated from the optical element is radiated so that the temperature of the optical element becomes lower than the environmental temperature of the optical module. Therefore, since control for keeping the temperature of the optical element constant is not required, it is not necessary to provide the ATC circuit. As a result, it is possible to further lower the cost.

While the first substrate 12 is directly disposed on the upper surface of the carrier 17 in the above explanation, it is also possible to provide a layout that has a substrate of low thermal conductivity like quartz (SiO$_2$) sandwiched between the first substrate 12 and the carrier 17. Based on this layout, it is possible to increase the thermal resistance between the first substrate 12 and the carrier 17. It is possible to prevent the heat radiated to the second substrate 18 from returning to the first substrate 12 again. Therefore, it is possible to further increase the heat radiation effect of the optical element 11.

The second carrier may be mounted on the bottom surface inside the case 30, and the driver may be mounted on the second carrier, instead of disposing the driver at the outside. In this case, a transmission line of the modulation current Im is provided on the carrier 17, and the modulation current Im transmitted from the driver inside the case is transferred to the first substrate 12. An RF signal consisting of a data signal and a clock signal is input to the driver inside, from the outside of the case via the feed-through 35a. The substrate used may have the second carrier and the first carrier separated from each other with a distance in order to avoid the rise in the temperature of the laser diode device due to the heat generated from the driver. When the temperature of the air inside the optical module becomes high due to the heat generated from the driver, two pairs of thermoelectric semiconductors may be provided to increase the cooling capacity. It is needless to mention that it is possible to mount the driver on the first substrate 12, and cool the driver together with the optical element 11.

It is possible to use a conductive adhesive agent in place of the solders 24, 25 and 26, and form a fillet in a triangular prism shape so that the conductive adhesive agent is connected to both the thermoelectric semiconductor and the pattern electrode.

Figure 4A:
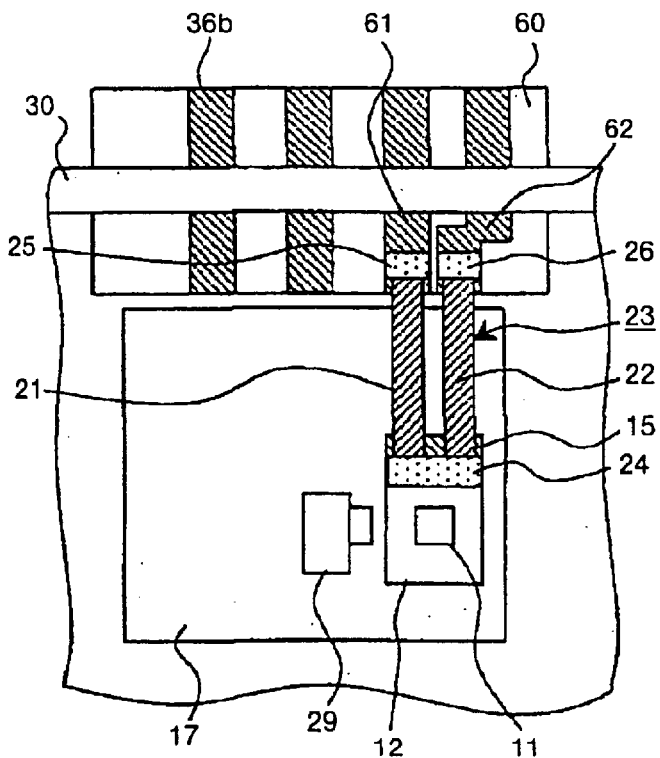
FIGS. 4A and 4B show a structure of an optical module according to a second embodiment of the present invention.
Figure 4B:
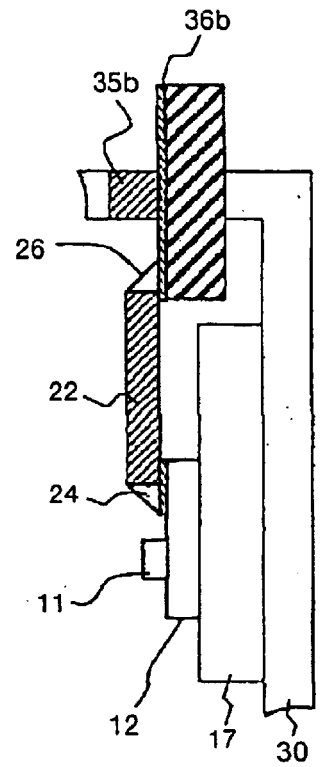

FIGS. 4A and 4B show an example of a layout of a thermoelectric semiconductor of an optical module according to a second embodiment of the present invention. FIG. 4A is a top plan view of the surrounding of the thermoelectric semiconductor according to the second embodiment. FIG. 4B is a side view of an optical element 11 that is observed from a connection surface of a lens holder.

In FIGS. 4A and 4B, sections that are identical with those shown in FIGS. 1A to 1F and FIGS. 2A to 2C are attached with like reference numbers. A reference number 60 denotes a feed-though that is provided on the left side wall of a case 32 when an optical fiber 33 is looked at from the optical element 11. The feed-through is electrically connected to the external power source circuit 51 (see FIG. 2A). A reference number 61 denotes a conductor line that is provided on the upper surface of the feed-through, and 62 denotes a key-shaped conductor line that is provided on the upper surface of the feed-through.

The feed-through 60 is provided with the conductor lines 61 and 62 on a flat surface that is stretched from the side wall of the case to the inside in the horizontal direction. A flat surface is also stretched from the side wall of the case to the outside in the horizontal direction, and these conductor lines 61 and 62 become connection terminals with the external power source circuit 51. The conductor line 61 is connected to the P-type semiconductor 21 via solder 25, and the conductor line 62 is connected to an N-type semiconductor 22 via solder 26.

Based on this arrangement, a driving current Ip of a thermoelectric semiconductor 23 that is supplied from the power source circuit 51 is input into the package via the conductor line 62. This driving current Ip flows to the N-type semiconductor 22 via the solder 26, further flows to the P-type semiconductor 21 that is connected in series with the N-type semiconductor 22, and reaches the conductor line 61 via the solder 25. The P-type semiconductor 21 and the N-type semiconductor 22 of the thermoelectric semiconductor 23 radiate heat that has been absorbed from a first substrate 12, to the feed-through 60. This heat is radiated from the feed-through 60 to the side wall of the case 32. The conductor line 62 has lines disposed with small intervals inside the package, and with large intervals at the outside of the package.

As a result of the above structure, the heat of the thermoelectric semiconductor 22 conducted through the conductor lines 61 and 62 on the upper surface of the feed-through 60 that is provided in stretch on the side wall of the package can be directly radiated to the upper surface of the feed-through 60 that is provided on the side wall of the package, without providing a second substrate.

It is possible to take large thermal resistance from the solder 25 to the first substrate 12 and from the solder 26 to the first substrate respectively. Therefore, it is possible to minimize the heat that returns to the first substrate 12.

As the thermoelectric semiconductor is directly connected to the electrode on the upper surface of the feed-through that is connected to the external power source circuit, it is not necessary to connect the thermoelectric semiconductor with conductor wires or the like in connecting the thermoelectric semiconductor to a pattern electrode.

Figure 5A:
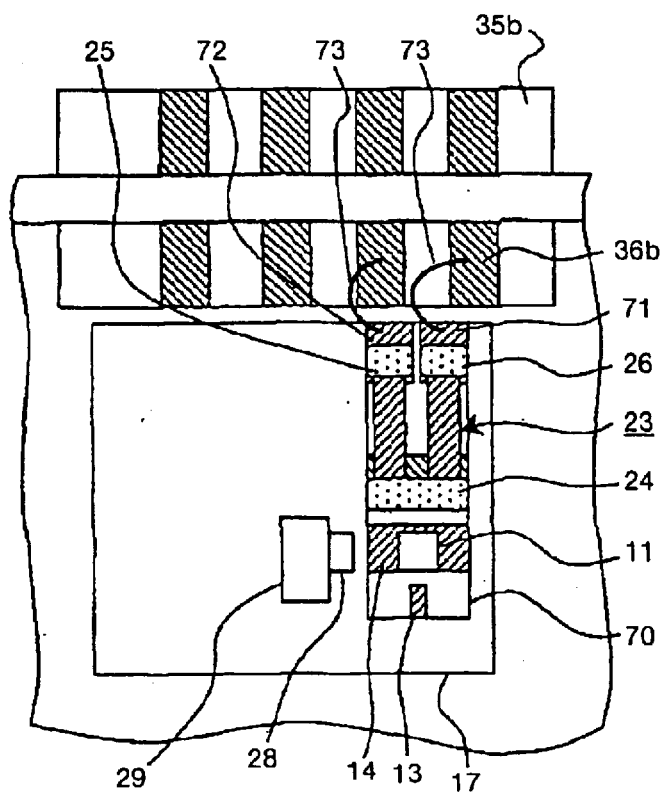
FIGS. 5A and 5B show a structure of an optical module according to a third embodiment of the present invention.
Figure 5B:
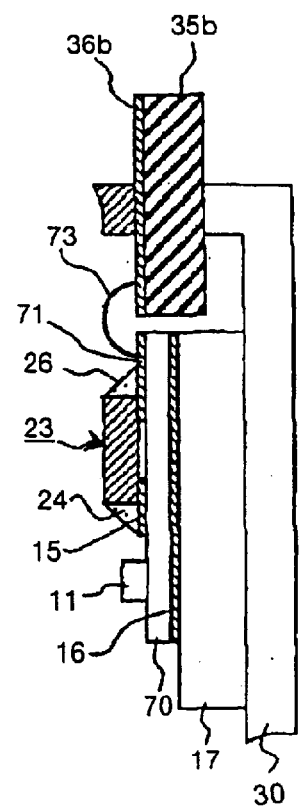

FIGS. 5A and 5B show an example of a layout of a thermoelectric semiconductor of an optical module according to a third embodiment of the present invention. FIG. 5A is a top plan view of the surrounding of the thermoelectric semiconductor according to the third embodiment. FIG. 5B is a side view of an optical element 11 that is observed from a connection surface of a lens holder.

In FIGS. 5A and 5B, sections that are identical with those shown in FIGS. 1A to 1F and FIGS. 2A to 2C are attached with like reference numbers. A reference number 70 denotes a first substrate on which the optical element 11 is mounted and which is prepared using a dielectric material such as aluminum nitride (AlN) or silicon carbide (SiC) that has high thermal conductivity. A conductor line 13, a ground conductor 14, and a pattern electrode 15 are provided on the upper surface of the first substrate 70. One side end of the P-type semiconductor 21 and an N-type semiconductor 22 respectively that constitute a thermoelectric semiconductor 23 is connected to the pattern electrode 15.

The ground conductor 14 is disposed between the conductor line 13 and the pattern electrode 15, with a distance between the conductor line 13, the pattern electrode 15, and the ground conductor 14, in a similar manner to that shown in FIGS. 1A to 1F. Based on this arrangement, these elements are insulated from each other. Reference numbers 71 and 72 denote pattern electrodes that are provided on the upper surface of the first substrate 70, and that are connected to the other side end of the P-type semiconductor 21 and the N-type semiconductor 22 respectively.

The pattern electrode 15 and the pattern electrodes 71 and 72 are insulated and separated from each other. The P-type semiconductor 21, the N-type semiconductor 22, and the first substrate 70 are not in contact with the intervals between the pattern electrode 15 and the pattern electrodes 71 and 72 respectively. Therefore, these intervals are non-contact portions. The pattern electrode 15 is connected to the first substrate 70 at a position closer to the semiconductor device 11 than at positions where the pattern electrodes 71 and 72 are connected to the first substrate 70.

The prism-shaped solder 24 is connected to one end of the P-type semiconductor 21 and the N-type semiconductor 22 respectively, and is also connected to the pattern electrode 15. The prism-shaped solders 25 and 26 are connected to the other end of the P-type semiconductor 21 and the N-type semiconductor 22 respectively, and are also connected to the pattern electrodes 72 and 71 respectively.

A reference number 73 denotes a conductor wire that connects between a conductor line 36b that is provided on the upper surface of a feed-through 35b and the pattern electrode 71, and connects between a conductor line 36b and the pattern electrode 72, respectively.

Based on the above structure, a driving current Ip of the thermoelectric semiconductor 23 that has been supplied from the power source circuit 51 (see FIG. 2A) is input to a package via the conductor line 36b, input to the pattern electrode 71 via the conductor wire 73 and the solder 26, and flows to the N-type semiconductor 22. Further, this driving current Ip flows to the P-type semiconductor 21 that is connected in series with the N-type semiconductor 22, reaches the pattern electrode 72 via the solder 25, and returns to the power source circuit 51 via the conductor wire 73 and the conductor line 36b. Based on this, the P-type semiconductor 21 and the N-type semiconductor 22 of the thermoelectric semiconductor 23 radiate the heat that has been absorbed from the pattern electrode 15 side of the first substrate 12, to the pattern electrodes 71 and 72.

As a result of this structure, the thermoelectric semiconductor 22 can radiate the heat absorbed from the periphery of the optical element 11 on the first substrate 70, far away from the optical element 11, without providing a second substrate. In other words, it is possible to lower the temperature near the optical element 11 as compared to the temperature at the other places in the first substrate 70.

A concave groove may be provided on the upper surface side of the first substrate 70 between the pattern electrode 15 and the pattern electrodes 71 and 72. In other words, a groove that is orthogonal with a heat transmission direction of the thermoelectric semiconductor is provided on the mounting surface of the thermoelectric semiconductor or on the opposite surface on the first substrate 70. Based on this, it is possible to decrease the heat that is conducted through the first substrate 70 and that returns to the lower portion of the pattern electrode 15 from the lower portions of the pattern electrodes 71 and 72.

Figure 6A:
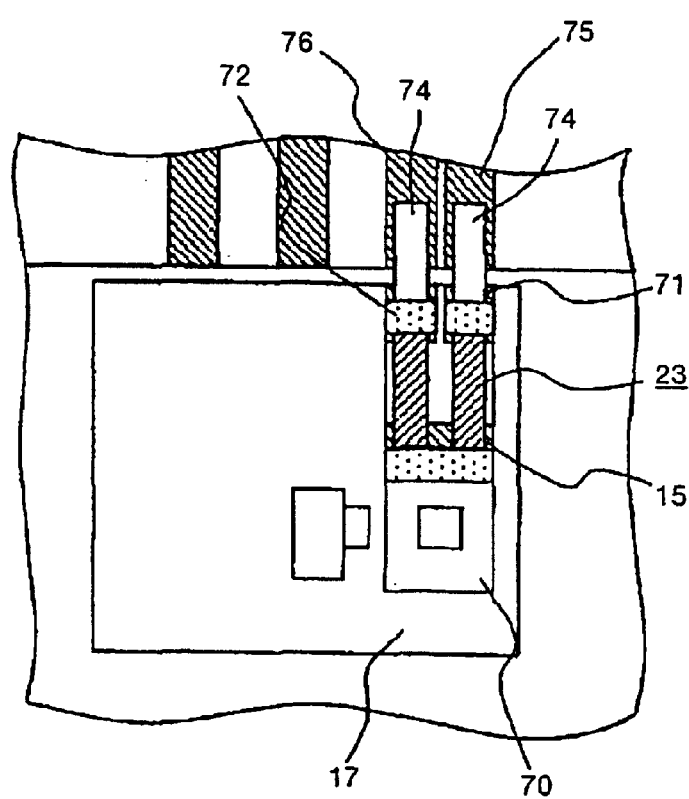
FIGS. 6A and 6B show a structure of an optical module according to a fourth embodiment of the present invention.
Figure 6B:
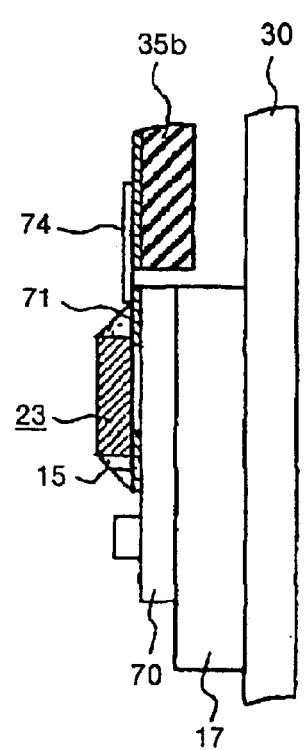

FIGS. 6A and 6B show an example of a layout of a thermoelectric semiconductor of an optical module according to a fourth embodiment of the present invention. FIG. 6A is a top plan view of the surrounding of the thermoelectric semiconductor according to the fourth embodiment. FIG. 6B is a side view of an optical element 11 that is observed from a connection surface of a lens holder.

In FIGS. 6A and 6B, sections that are identical with those shown in FIGS. 1A to 1F, FIGS. 2A to 2C, and FIGS. 5A and 5B are attached with like reference numbers. A reference number 74 denotes a lead that is made of a conductor plate like copper having low thermal resistance and that connects a conductor line 36b that is provided on the upper surface of a feed-through 35b to pattern electrodes 71 and 72. Reference numbers 75 and 76 denote conductor lines that are provided on the upper surface of the feed-through 35b.

One end of the lead having low thermal resistance is connected to an electrode of a heat radiation side of a thermoelectric semiconductor 23, and the other end of this lead is connected to the feed-through on the side wall of a package. Based on this, it is possible to improve the heat radiation efficiency of the thermoelectric semiconductor.

Figure 7A:
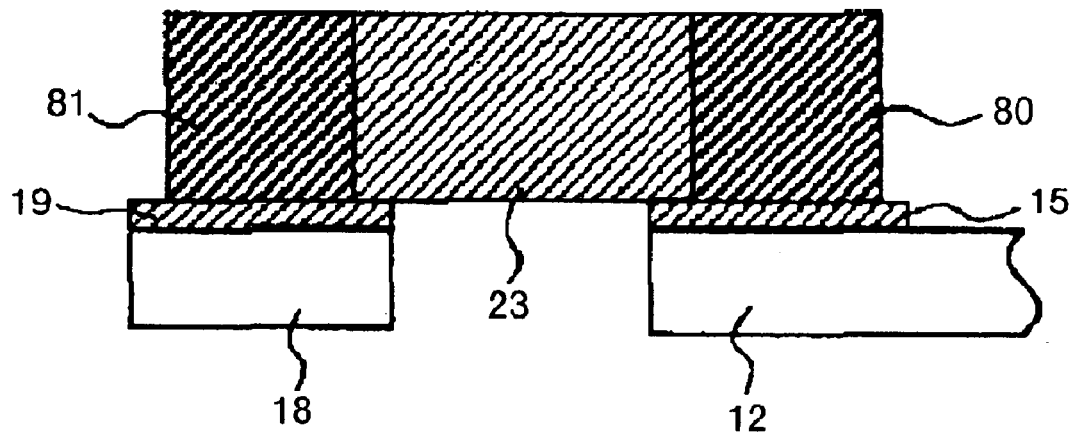
FIGS. 7A and 7B show a structure of an optical module according to a fifth embodiment of the present invention.
Figure 7B:
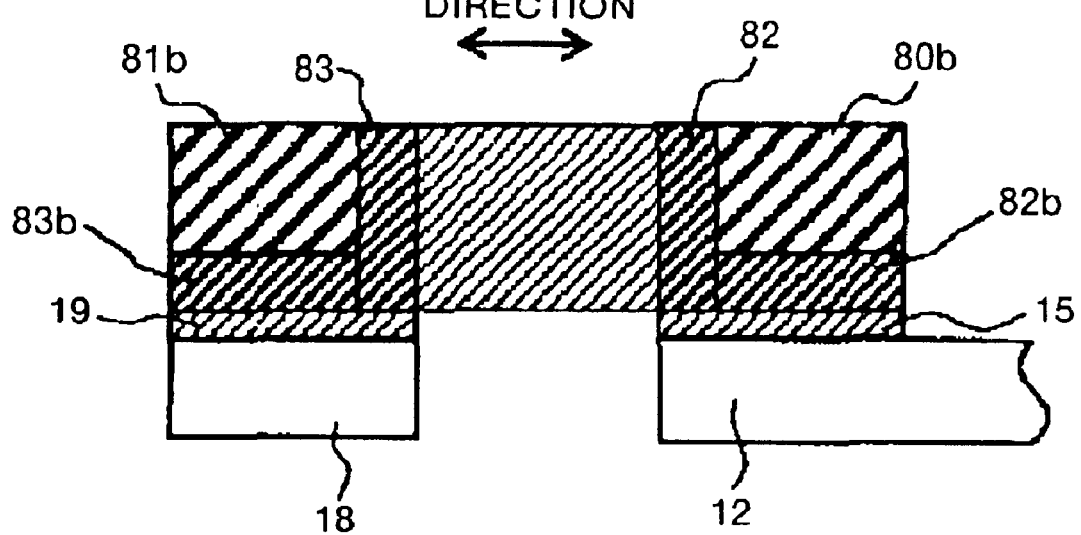

A fifth embodiment of the present invention shows other state of connection between a thermoelectric semiconductor and pattern electrodes. FIG. 7A is a side view of an example of a connection between a thermoelectric semiconductor and a pattern electrode according to the present embodiment. FIG. 7B is a side view of an example in which both end side surfaces of the thermoelectric semiconductor are formed with metallic material.

In FIG. 7A, reference numbers 80 and 81 denote blocks having good thermal conductivity. These blocks 80 and 81 are connected by solder to both ends of the P-type semiconductor 21 or the N-type semiconductor 22 respectively that constitutes a thermoelectric semiconductor 23. When the construction according to the fifth embodiment is to be applied to the P-type semiconductor 21 of the first embodiment, for example, the block 80 is connected to the pattern electrode 15 by solder, and the block 81 is connected to the pattern electrode 19 by solder. On the other hand, when the construction according to the fifth embodiment is to be applied to the other embodiments, the blocks are connected to corresponding pattern electrodes by solder similarly.

The blocks 80 and 81 have increased heat radiation efficiency because they have high thermal conductivity and a cross-sectional shape of which in the heat transmission direction is approximately the same as a cross-sectional shape of the thermoelectric semiconductor. It is general that the thermoelectric semiconductor has low thermal conductivity in order to increase the heat radiation efficiency based on a heat pump operation. The thermoelectric semiconductor does not transmit heat easily in a direction that is orthogonal with the heat transmission direction. Therefore, when the blocks 80 and 81 are connected to the end surfaces of the thermoelectric semiconductor 23, it is possible to spread the heat that is conducted in the heat transmission direction of the thermoelectric semiconductor 23, to side surface directions of the thermoelectric semiconductor 23 (the thickness directions of the first substrate 12 and the second substrate 18).

As a result, it is possible to efficiently transmit heat between the thermoelectric semiconductor 23 and the pattern electrodes that are connected to the side surface perpendicular to the heat transmission direction of the thermoelectric semiconductor 23.

In order to lower the manufacturing cost, it is desirable that these blocks are constructed of metal conductors made of copper or the like from the viewpoint of easiness of connection with the pattern electrodes. When the surroundings of both ends of the thermoelectric semiconductor are formed with metallic material to make it possible to have an electric connection with the pattern electrodes, it is possible to use a dielectric material for the blocks.

For example, as shown in FIG. 7B, the surroundings of the side surfaces of both ends of the thermoelectric semiconductor 23 may be formed with metallic material as shown by 82 and 83. Then, dielectrics 80b and 81b of good thermal conductivity are connected to both end surfaces of the thermoelectric semiconductor 23 respectively. The lower surfaces and the lower sides of the side surfaces (surfaces that are in contact with the pattern conductors) of the dielectrics 80b and 81b are formed with metallic material as shown by 82b and 83b. Based on this, it is possible to connect the lower surfaces to the pattern conductors 15 and 19 with solder or an adhesive agent of good thermal conductivity. In this case, it is possible to form with metallic material the lower portions of the side surfaces of the dielectrics 80b and 81b toward the thermoelectric semiconductor 23, in an inverse L-shape.

As explained above, when the thermoelectric semiconductor 23 is connected to the pattern electrodes using the blocks 80 and 81, it is possible to more increase the heat radiation efficiency of the thermoelectric semiconductor 23 than when the thermoelectric semiconductor 23 is connected to the pattern electrodes using prism-shaped solder.

When the thermoelectric semiconductor 23 is provided with portions 82 and 83 formed with metallic material, it becomes easy to install the thermoelectric semiconductor 23 on the surfaces of the pattern electrodes 12 and 18 with solder. The reliability of the soldered portion after the installation on the surface becomes high.

Figure 8A:
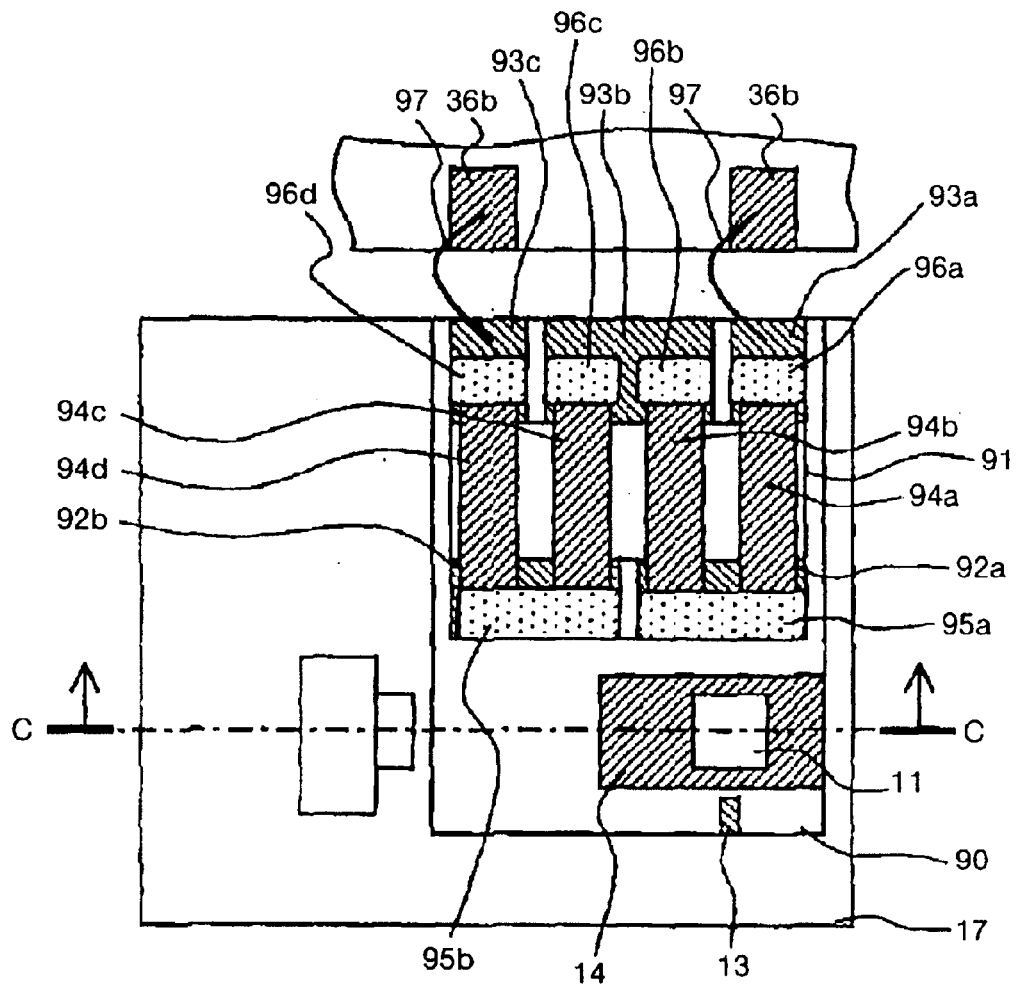
FIGS. 8A and 8B show a structure of an optical module according to a sixth embodiment of the present invention.
Figure 8B:
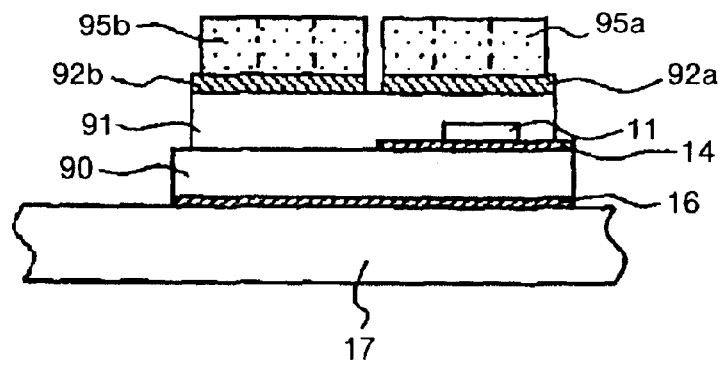
Figure 9A:
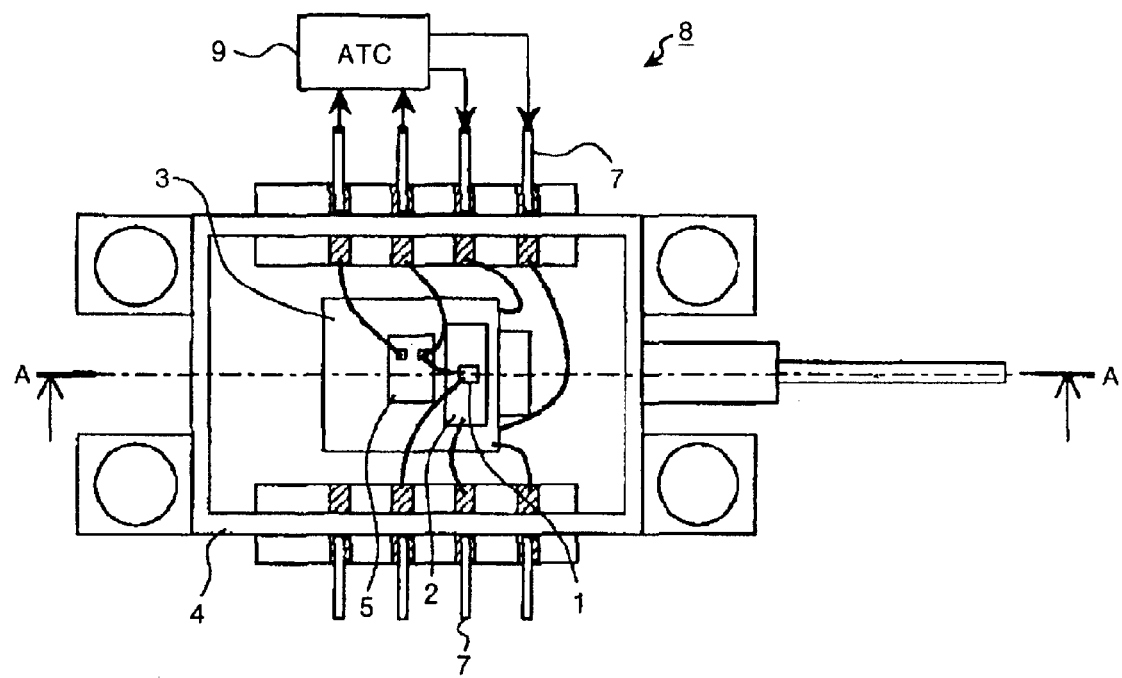
FIGS. 9A and 9B show a structure of a conventional optical module.
Figure 9B:
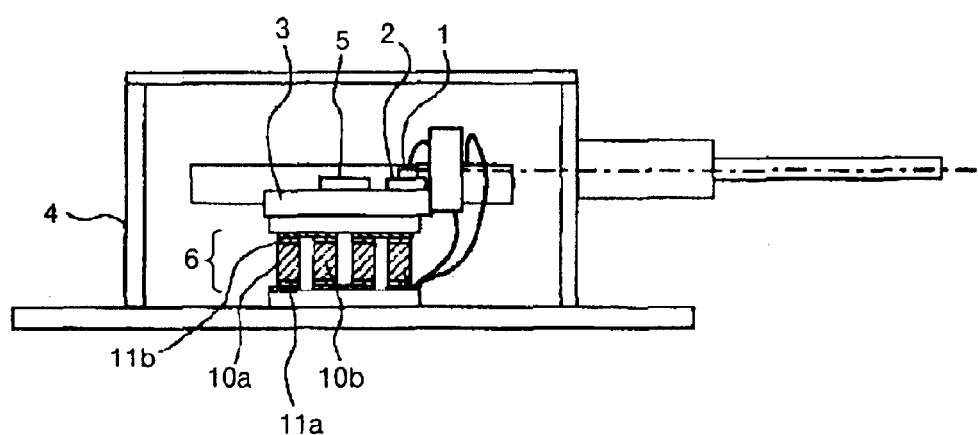

FIGS. 8A and 8B show an example of a layout of a thermoelectric semiconductor of an optical module according to a sixth embodiment of the present invention. FIG. 8A is a top plan view of the surrounding of the thermoelectric semiconductor according to the sixth embodiment. FIG. 8B is a side view of the thermoelectric semiconductor cut along a line C—C.

In FIGS. 8A and 8B, sections that are identical with those shown in FIGS. 1A to 1F and FIGS. 2A to 2C are attached with like reference numbers. A reference number 90 denotes a first substrate on which the optical element 11 is mounted and that is prepared using a dielectric material such as aluminum nitride (AlN) or silicon carbide (SiC) that has high thermal conductivity. The conductor line 13 and the ground conductor 14 are provided on the upper surface of the first substrate 90. A reference number 91 denotes a second substrate that is mounted on the upper surface of the first substrate 90 near the optical element 11. The second substrate 91 is prepared using a dielectric material such as aluminum nitride (AlN) or silicon carbide (SiC) that has high thermal conductivity. Reference numbers 92a and 92b denote pattern electrodes that are provided on the upper surface of the second substrate 91, and 93a, 93b, and 93c denote pattern electrodes that are provided on the upper surface of the second substrate 91. The pattern electrodes 92 and 93 are disposed with a distance between them. The pattern electrode 92 is disposed closer to the optical element 11, and the pattern electrode 93 is disposed little away from the optical element 11. The pattern electrode 93b is disposed by being sandwiched between the pattern electrode 93a and the pattern electrode 93c. These pattern electrodes are separated and insulated from each other.

A reference number 94 denote a thermoelectric semiconductor that has a plurality of (four in the figure) P-type semiconductors 94b, 94d and N-type semiconductors 94a, 94c. The pattern electrodes 92 and 93 are connected so that the P-type semiconductor and the N-type semiconductor are disposed alternately in series. In other words, one end side surface of an N-type semiconductor 94a is connected to a pattern electrode 92a, and the other end side surface of the N-type semiconductor 94a is connected to a pattern electrode 93a. One end side surface of a P-type semiconductor 94b is connected to the pattern electrode 92a, and the other end side surface is connected to a pattern electrode 93b. One end side surface of the N-type semiconductor 94c is connected to a pattern electrode 92b, and the other end side surface is connected to a pattern electrode 93b. One end side surface of the P-type semiconductor 94d is connected to the pattern electrode 92b, and the other end side surface is connected to a pattern electrode 93c.

Prism-shaped solder 95a is connected to one end of the N-type semiconductor 94a and the P-type semiconductor 94b respectively, and is also connected to the pattern electrode 92a. Prism-shaped solders 96a, 96b, 96c, and 96d are connected to the N-type semiconductor 94a, the N-type semiconductor 94c, and the P-type semiconductor 94d respectively, and are also connected to the pattern electrodes 93a, 93b, 93b, and 93c respectively. A reference number 97 denotes a conductor wire that connects between a conductor line 36b that is provided on the upper surface of a feedthrough 35b and the pattern electrode 93a, and connects between a conductor line 36b and the pattern electrode 93c, respectively.

Based on the above structure, a driving current Ip of the thermoelectric semiconductor 94 that has been supplied from a power source circuit 51 is input to the package via the conductor line 36b, input to the pattern electrode 93a via the conductor wire 97 and the solder 96a, and flows to the N-type semiconductor 94a. Further, this driving current Ip flows to the P-type semiconductor 94b that is connected in series with the N-type semiconductor 94a, and flows to the N-type semiconductor 94c via the solder 96b, the pattern electrode 93b, and the solder 96c. Further, the driving current Ip reaches the pattern electrode 93c via the pattern electrode 92b, or the solder 95b, the P-type semiconductor 94d, and the solder 96d, and returns to the power source circuit 51 via the conductor wire 97 and the conductor line 36b. Based on this, the P-type semiconductor 94a and the N-type semiconductor 94b of the thermoelectric semiconductor 94 radiate the heat that has been absorbed from the pattern electrode 92 side of the second substrate 91, to the pattern electrode 93 side.

According to the sixth embodiment, the thermoelectric semiconductor can radiate the heat absorbed via the second substrate from the optical element on the first substrate, to a position with a distance from the optical element on the second substrate. In other words, it is possible to lower the temperature near the optical element as compared to the temperature at other places in the first substrate.

By disposing a plurality of thermoelectric semiconductors on one substrate, it is possible to form a unit on which the thermoelectric semiconductors are integrally mounted. Therefore, when there are a plurality of (two or more) pairs of thermoelectric semiconductors, it is possible to inspect the thermoelectric semiconductor as a single unit. Further, it becomes easy to mount the thermoelectric semiconductors on the carrier of the optical module.

When a groove that is orthogonal with a heat transmission direction of the thermoelectric semiconductor is provided on the mounting surface of the thermoelectric semiconductor or on the opposite surface on the second substrate 91, it becomes possible to decrease the heat that is conducted through the second substrate 92 and that returns to the lower portion of the pattern electrode 94 from the lower portion of the pattern electrode 93.

According to the present invention, by disposing the thermoelectric semiconductor in a direction horizontal with the bottom surface of the optical module, it becomes possible to lower the height of the optical module. Further, by decreasing the number of pairs of thermoelectric semiconductors, it becomes possible to realize a low-price optical module.

It is possible to set the environmental temperature at which the optical module is used near the upper limit temperature of the operation temperature of the laser diode.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An optical module comprising:

a substrate having at least one surface;

an optical element that is mounted on the surface of the substrate; and one or a plurality of thermoelectric semiconductors, each of the thermoelectric semiconductors having a P-type semiconductor and an N-type semiconductor disposed in parallel, each thermoelectric semiconductor having two ends, a heat transferring side, and a heat absorbing side, wherein at least one end of each the thermoelectric semiconductor is mounted on the surface of the substrate, and a direction from the heat absorbing side to the heat transferring side is parallel with the surface of the substrate.

2. The optical module according to claim 1, wherein the heat absorbing side is disposed closer to the optical element, and the heat transferring side is disposed away from the optical element.

3. The optical module according to claim 1, wherein the substrate comprises a first electrode near the optical element, and a second electrode and a third electrode at a distance from the optical element, and wherein, for a thermoelectric semiconductor of said one or a plurality of thermoelectric semiconductors
a side surface of one end of the P-type semiconductor and a side surface of one end of the N-type semiconductor respectively are connected to the first electrode,
a side surface of the other end of the P-type semiconductor is connected to the second electrode, and
a side surface of the other end of the N-type semiconductor is connected to the third electrode.

4. The optical module according to claim 3, further comprising:

a case that supports the substrate and that has a side wall, the side wall having a surface, wherein fourth and fifth electrodes are provided at the surface of the side wall, the fourth and the fifth electrodes being connected to the second and third electrodes respectively.

5. The optical module according to claim 4, wherein the second and fourth electrodes are connected together with an electrically conducting wire, and the third and fifth electrodes are connected together with another electrically conducting wire.

6. The optical module according to claim 4, wherein the second and fourth electrodes are connected together with an electrically conducting plate, and the third and fifth electrodes are connected together with another electrically conducting plate.

7. The optical module according to claim 6, wherein the conductor plate includes Cu.

8. The optical module according to claim 1, further comprising:

a first conductor, a second conductor and a third conductor, wherein for a given thermoelectric semiconductor of said one or a plurality of thermoelectric semiconductors
the first conductor is connected to one end surface of the P-type semiconductor and one end surface of the N-type semiconductor respectively and the surface side of the substrate,
the second conductor is, connected to the other end surface of the P-type semiconductor and the surface of the substrate; and the third conductor is connected to the other end surface of the N-type semiconductor and the surface side of the substrate.

9. The optical module according to claim 1, further comprising:

a dielectric substrate, wherein for a given thermoelectric semiconductor of said one or a plurality of thermoelectric semiconductors the dielectric substrate supports a side surface of one end and a side surface of the other end of the P-type semiconductor respectively, and supports a side surface of one end and a side surface of the other end of the N-type semiconductor respectively, the dielectric substrate having a portion not in contact with the P-type semiconductor between the one end and the other end of the P-type semiconductor, and having a portion not in contact with the N-type semiconductor between the one end and the other end of the N-type semiconductor, wherein the dielectric substrate is mounted to the substrate.

10. An optical module comprising:

an optical element;

one or a plurality of thermoelectric semiconductors, each of the thermoelectric semiconductors having a P-type semiconductor and an N-type semiconductor disposed in parallel, each P-type semiconductor and the N-type semiconductor having two ends;

a first substrate having at least a front and rear surfaces, wherein the optical element is mounted on the front surface on the first substrate, and, wherein for a given thermoelectric semiconductor of said one or a plurality of thermoelectric semiconductors, a side surface of one end of the P-type semiconductor and a side surface of one end of the N-type semiconductor are connected to the front surface of the first substrate;

a second substrate that is disposed with a distance from the first substrate, the second substrate having at least front and rear surfaces, wherein, for the given thermoelectric semiconductor, a side surface of the other end of the P-type semiconductor and a side surface of the other end of the N-type semiconductor are connected to the front surface of the second substrate; and a base on which the rear surfaces of the first and second substrates are mounted.

11. The optical module according to claim 10, further comprising a case that supports the base.

12. The optical module according to claim 10, further comprising:

a first conductor, a second conductor, and a third conductor, wherein for the given thermoelectric semiconductor
the first conductor is connected to one end surface of the P-type semiconductor and one end surface of the N-type semiconductor respectively,
the second conductor is connected to the other end surface of the P-type semiconductor, and
the third conductor is connected to the other end surface of the N-type semiconductor.

13. The optical module according to claim 10, further comprising:

a first conductor, a second conductor, a third conductor, a fourth conductor, and a fifth conductor, wherein
the first and second conductors are connected to one end surface and the other end surface of the P-type semiconductor of one of the thermoelectric semiconductors respectively,
the third and fourth conductors are connected to one end surface and the other end surface of the N-type semiconductor of another one of the thermoelectric semiconductors respectively, and
the fifth conductor is connected between the first and third conductors.

14. The optical module according to claim 10, further comprising:

a first electrode provided on the front surface of the first substrate;

a second electrode provided on the front surface of the second substrate; and a third electrode provided on the front surface of the second substrate, wherein for the given thermoelectric semiconductor
the first electrode is connected to a side surface of one end of the P-type semiconductor and a side surface of one end of the N-type semiconductor respectively,
the second electrode is connected to a side surface of the other end of the P-type semiconductor, and
the third electrode is connected to a side surface of the other end of the N-type semiconductor.

15. The optical module according to claim 11, wherein the case has a shape such that it houses the optical module.

16. The optical module according to claim 10, wherein the second substrate has a shape such that its front surface lies in the same plane as the front surface of the first substrate.

17. The optical module according to claim 16, further comprising:

a first conductor, a second conductor and a third conductor, wherein for the given thermoelectric semiconductor
the first conductor is connected to one end surface of the P-type semiconductor and the N-type semiconductor respectively,
the second conductor is connected to the other end surface of the P-type semiconductor, and
the third conductor is connected to the other end surface of the N-type semiconductor.

18. The optical module according to claim 16, further comprising:

a case that supports the base and that has a side wall;

a first electrode provided on the surface of the first substrate;

a second electrode provided on a surface of the side wall; and a third electrode provided on the surface of the side wall, wherein for the given thermoelectric semiconductor
the first electrode is connected to a side surface of one end of the P-type semiconductor and a side surface of one end of the N-type semiconductor respectively,
the second electrode is connected to a side surface of the other end of the P-type semiconductor, and
the third electrode is connected to a side surface of the other end of the N-type semiconductor.

19. An optical transceiver apparatus comprising:

an optical module having
a substrate having at least one surface;
an optical element that is mounted on the surface of the substrate; and one or a plurality of thermoelectric semiconductors, each of the thermoelectric semiconductors having a P-type semiconductor and an N-type semiconductor disposed in parallel, each thermoelectric semiconductor having two ends, a heat transferring side, and a heat absorbing side, wherein at least one end of each thermoelectric semiconductor is mounted on the surface of the substrate, and a direction from the heat absorbing side to the heat transferring side is parallel with the substrate; and a circuit that provides a constant current to each the thermoelectric semiconductor to drive each thermoelectric semiconductor.

* * * * *